(12) United States Patent
Okada et al.

(10) Patent No.: US 7,959,737 B2
(45) Date of Patent: Jun. 14, 2011

(54) FILM FORMATION APPARATUS AND METHOD FOR USING THE SAME

(75) Inventors: Mitsuhiro Okada, Nirasaki (JP); Satoshi Mizunaga, Nirasaki (JP); Yamato Tonegawa, Nirasaki (JP); Toshiharu Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 895 days.

(21) Appl. No.: 11/905,628

(22) Filed: Oct. 2, 2007

(65) Prior Publication Data

US 2008/0132079 A1   Jun. 5, 2008

(30) Foreign Application Priority Data

Oct. 4, 2006 (JP) .................................. 2006-272575
Aug. 31, 2007 (JP) .................................. 2007-225479

(51) Int. Cl.
*C25F 1/00* (2006.01)
*C25F 3/30* (2006.01)
*C25F 5/00* (2006.01)

(52) U.S. Cl. .......... 134/1.1; 134/22.1; 134/26; 134/902; 118/66

(58) Field of Classification Search .................. 438/734, 438/706, 166; 118/166; 257/E21.002; 134/1.1, 134/21.1, 26, 902
See application file for complete search history.

(56) References Cited

U.S. PATENT DOCUMENTS

| 5,709,757 | A  | * | 1/1998  | Hatano et al. .............. 134/22.14 |
| 6,503,843 | B1 | * | 1/2003  | Xia et al. ....................... 438/706 |
| 7,288,284 | B2 | * | 10/2007 | Li et al. .......................... 427/237 |
| 2003/0037802 | A1 | * | 2/2003 | Nakahara et al. .............. 134/1.1 |

FOREIGN PATENT DOCUMENTS

JP        03-293726        12/1991

* cited by examiner

*Primary Examiner* — Nadine G Norton
*Assistant Examiner* — Mahmoud Dahimene
(74) *Attorney, Agent, or Firm* — Smith, Gambrell & Russell, LLP

(57) ABSTRACT

A method for using a film formation apparatus for a semiconductor process includes a first cleaning process of removing by a first cleaning gas a by-product film from an inner surface of a reaction chamber of the film formation apparatus, while supplying the first cleaning gas into the reaction chamber, and setting an interior of the reaction chamber at a first temperature and a first pressure to activate the first cleaning gas. The method further includes a second cleaning process of then removing by a second cleaning gas a contaminant from the inner surface of the reaction chamber, while supplying the second cleaning gas into the reaction chamber, and setting the interior of the reaction chamber at a second temperature and a second pressure to activate the second cleaning gas. The second cleaning gas includes a chlorine-containing gas.

15 Claims, 5 Drawing Sheets

FILM FORMATION APPARATUS AND METHOD FOR USING THE SAME

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon oxide film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is decreased to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the inner surface of the reaction tube, a stress is generated and causes peeling of some of the by-product films and the quartz of the reaction tube due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are thereby dry-etched and removed by the cleaning gas. Jpn. Pat. Appln. KOKAI Publication No. 3-293726 discloses a cleaning method of this kind. However, as described later, the present inventors have found that conventional cleaning methods of this kind may cause problems in that, when a film formation process is performed inside a reaction tube after cleaning thereof, contamination, such as metal contamination, occurs on the formed film, so the yield of semiconductor devices to be manufactured is decreased

BRIEF SUMMARY OF THE INVENTION

An object of the present invention is to provide a film formation apparatus for a semiconductor process and a method for using the same, which can prevent the formed film from suffering contamination after cleaning.

According to a first aspect of the present invention, there is provided a method for using a film formation apparatus for a semiconductor process, the method comprising: a first cleaning process of removing by a first cleaning gas a by-product film from an inner surface of a reaction chamber of the film formation apparatus, while supplying the first cleaning gas into the reaction chamber, and setting an interior of the reaction chamber at a first temperature and a first pressure to activate the first cleaning gas; and a second cleaning process of then removing by a second cleaning gas a contaminant from the inner surface of the reaction chamber, while supplying the second cleaning gas into the reaction chamber, and setting the interior of the reaction chamber at a second temperature and a second pressure to activate the second cleaning gas, the second cleaning gas comprising a chlorine-containing gas.

According to a second aspect of the present invention, there is provided a film formation apparatus for a semiconductor process, comprising: a reaction chamber configured to accommodate a target substrate; an exhaust system configured to exhaust an interior of the reaction chamber; a film formation gas supply circuit configured to supply a film formation gas, for forming a film on the target substrate, into the reaction chamber; a first cleaning gas supply circuit configured to supply a first cleaning gas, for removing a by-product film derived from the film formation gas from an inner surface of the reaction chamber, into the reaction chamber; a second cleaning gas supply circuit configured to supply a second cleaning gas, for removing a contaminant from the inner surface of the reaction chamber, into the reaction chamber, the second cleaning gas comprising a chlorine-containing gas; a first activation mechanism configured to activate the first cleaning gas; a second activation mechanism configured to activate the second cleaning gas; and a control section configured to control an operation of the apparatus, wherein the control section executes a first cleaning process of removing by the first cleaning gas a by-product film from the inner surface of the reaction chamber, while supplying the first cleaning gas into the reaction chamber, and setting the interior of the reaction chamber at a first temperature and a first pressure to activate the first cleaning gas; and a second cleaning process of then removing by the second cleaning gas a contaminant from the inner surface of the reaction chamber, while supplying the second cleaning gas into the reaction chamber, and setting the interior of the reaction chamber at a second temperature and a second pressure to activate the second cleaning gas.

According to a third aspect of the present invention, there is provided a computer readable medium containing program instructions for execution on a processor, which, when executed by the processor, cause a film formation apparatus for a semiconductor process to execute a first cleaning process of removing by a first cleaning gas a by-product film from an inner surface of a reaction chamber of the film formation apparatus, while supplying the first cleaning gas into the reaction chamber, and setting an interior of the reaction chamber at a first temperature and a first pressure to activate the first cleaning gas; and a second cleaning process of then removing by a second cleaning gas a contaminant from the inner surface of the reaction chamber, while supplying the second cleaning gas into the reaction-chamber, and setting the interior of the reaction chamber at a second temperature and a second pressure to activate the second cleaning gas, the second cleaning gas comprising a chlorine-containing gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
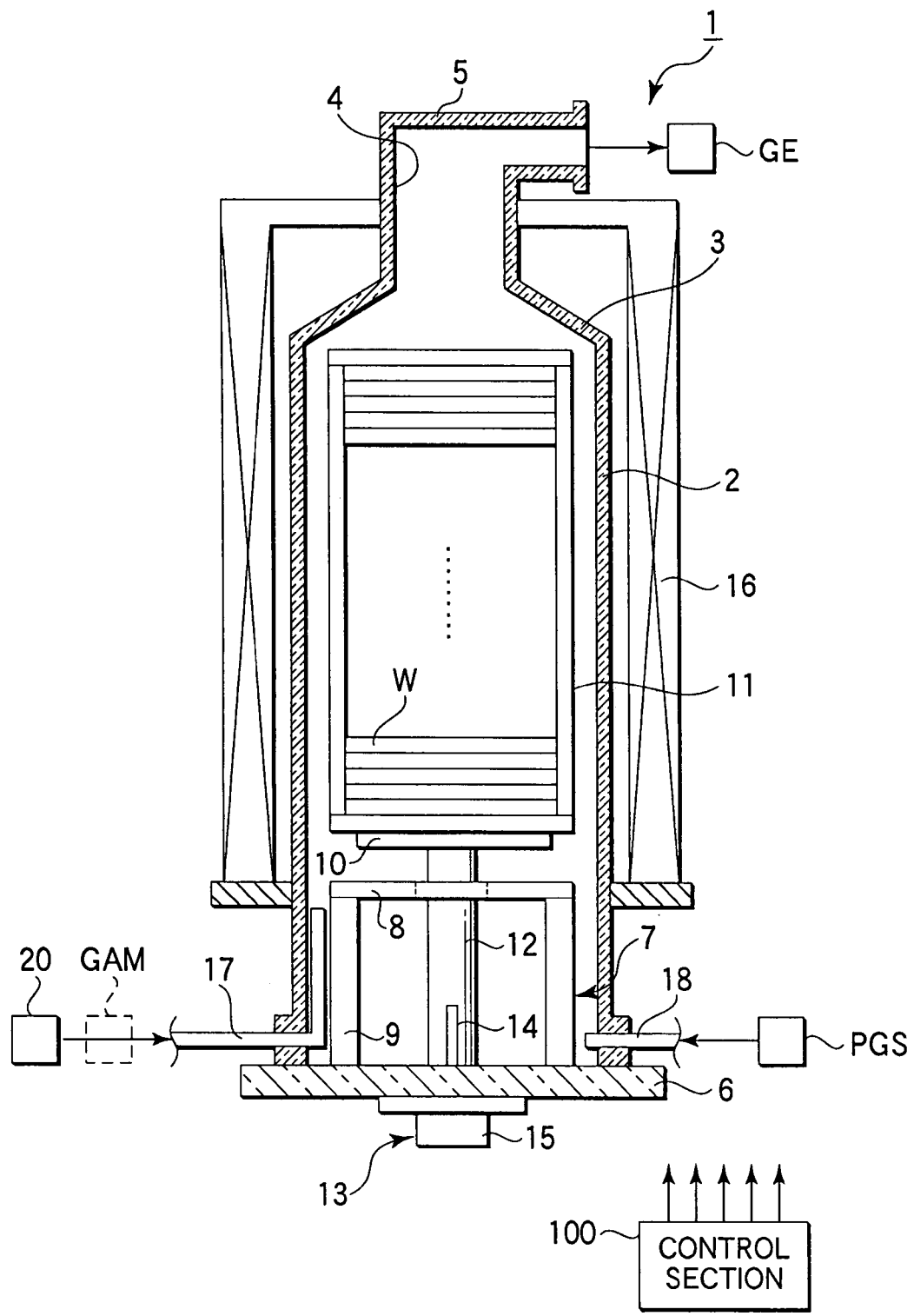
FIG. 1 is a view showing a vertical heat-processing apparatus according to an embodiment of the present invention.

In the process of developing the present invention, the inventors studied problems with regard to conventional methods for cleaning the interior of a reaction tube used in a film formation apparatus for a semiconductor process. As a result, the inventors have arrived at the findings given below.

Specifically, where a cleaning gas, such as hydrogen fluoride, is supplied into a reaction tube, the interior of the gas supply line may be corroded, and a metal compound and/or a metal element thereby produced are deposited on and/or impregnated in the inner surface of the reaction tube. Contaminants of this kind are discharged from the inner surface of the reaction tube when a film formation process is performed under a low pressure inside the reaction tube. Consequently, contamination, such as metal contamination, occurs on the formed film, thereby decreasing the yield of semiconductor devices.

In order to solve these problems, for example, hydrogen fluoride (HF) solution may be used to clean the reaction tube. In this case, by-product films are removed by wet etching. However, this wet etching requires work operations for detaching the reaction tube, manually cleaning the tube, and then reattaching and adjusting the tube. Further, the heat-processing apparatus needs to be shut down for a long time, thereby increasing downtime of the apparatus and lowering the operating rate thereof.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
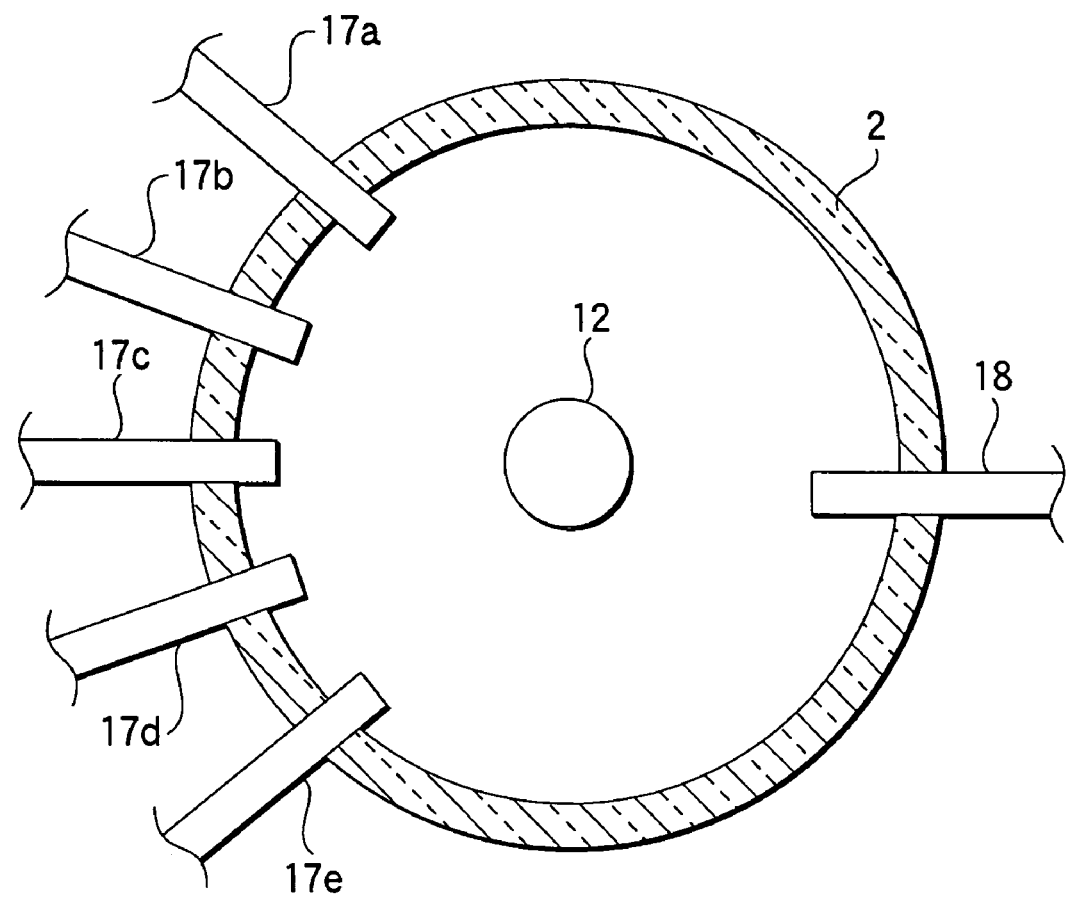
FIG. 2 is a sectional plan view of the apparatus shown in FIG. 1.

FIG. 1 is a view showing a vertical heat-processing apparatus according to an embodiment of the present invention. FIG. 2 is a sectional plan view of the apparatus shown in FIG. 1. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz (or silicon carbide (SiC)).

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz (or silicon carbide) The lid 6 is moved up and down by a boat elevator described later (not shown in FIG. 1, but shown in FIG. 3 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, such as 100, semiconductor wafers W at predetermined intervals in the vertical direction. The wafer boat 11 is made of a heat-resistant and corrosion-resistant material, such as quartz (or silicon carbide). Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as film formation gases and cleaning gases) into the reaction tube 2. Each of the process gas feed lines 17 is connected to a process gas supply section 20 through a mass-flow controller (MFC) (not shown).

For example, as a film formation gas for forming a silicon nitride film (product film) on semiconductor wafers W by CVD, a first film formation gas containing a silane family gas and a second film formation gas containing a nitriding gas are used. In this embodiment, the silane family gas is dichlorosilane (DCS: $SiH_2Cl_2$) gas and the nitriding gas is ammonia ($NH_3$) gas.

As a first cleaning gas for removing a by-product film deposited inside the reaction tube 2, a halogen-containing acidic gas or a mixture gas of a halogen gas and hydrogen gas is used. In this embodiment, the first cleaning gas is a mixture gas of fluorine gas, hydrogen fluoride gas, and nitrogen gas used as a dilution gas.

As a second cleaning gas for removing a contaminant present at the inner surface of the reaction tube 2, a gas comprising a chlorine-containing gas is used. In this embodiment, the second cleaning gas is a gas comprising DCS.

Although FIG. 1 shows only one process gas feed line 17, a plurality of process gas feed lines 17 are disposed in accordance with the type of gases in this embodiment as shown in FIG. 2. Specifically, this apparatus includes five process gas feed lines 17 penetrating the sidewall of the reaction tube 2 near the bottom, which are formed of a DCS feed line 17a for supplying DCS, an ammonia feed line 17b for supplying ammonia, a fluorine feed line 17c for supplying fluorine, a hydrogen fluoride feed line 17d for supplying hydrogen fluoride, and a nitrogen feed line 17e for supplying nitrogen.

A purge gas supply line 18 also penetrates the sidewall of the reaction tube 2 near the bottom. The purge gas supply line 18 is connected to a purge gas supply source PGS through a mass-flow controller (MFC) (not shown).

Figure 3:
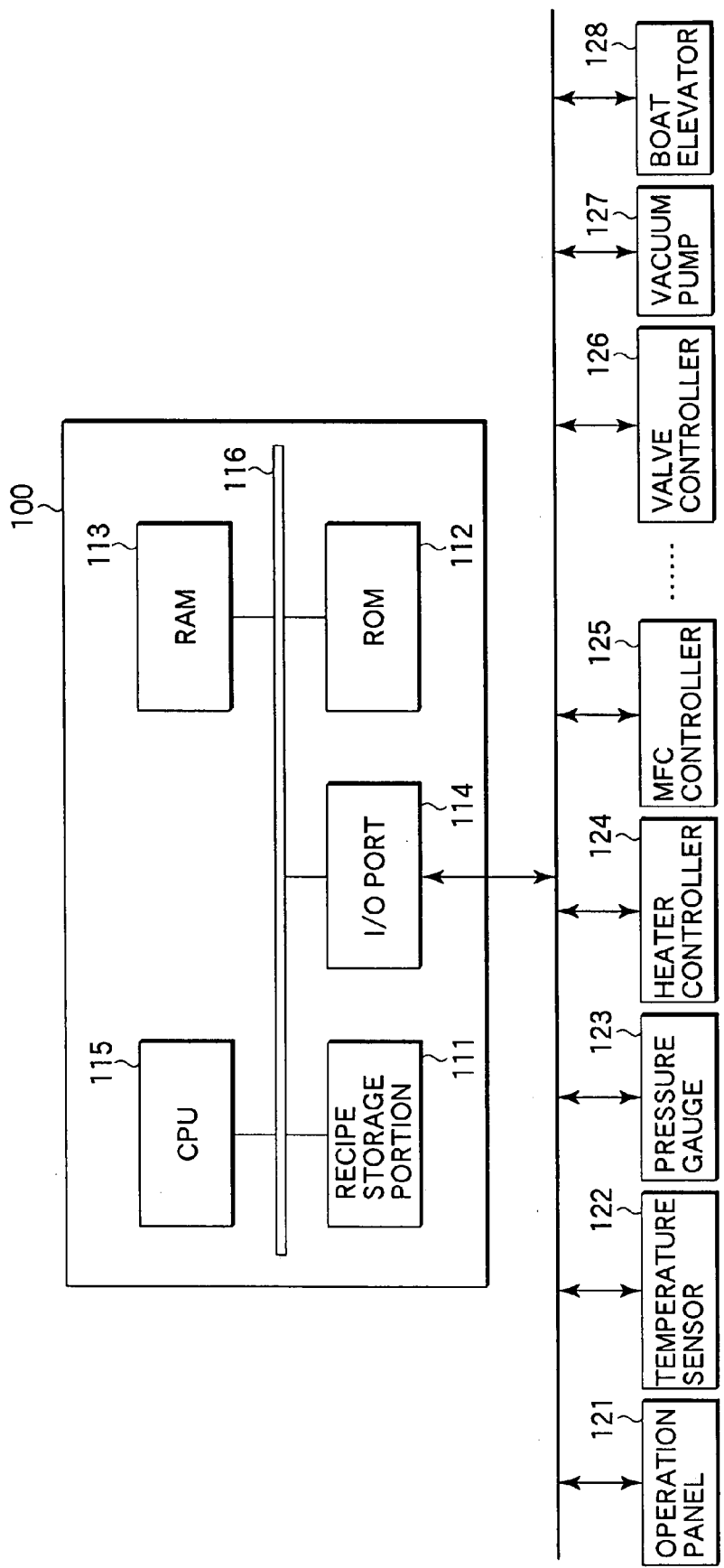
FIG. 3 is a view showing the structure of the control section of the apparatus shown in FIG. 1.

The heat-processing apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, heater controllers 124, MFC controllers 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 5, and process gas feed lines 17, and to transmit measurement values to the control section 100. The (group of) pressure gages 123 are configured to measure the pressure at respective portions inside the reaction tube 2, exhaust line 5, and process gas feed lines 17, and to transmit measurement values to the control section 100.

The heater controllers 124 are configured to respectively control the heater 8 and heater 16. The heater controllers 124 turn on these heaters to generate heat in accordance with instructions from the control section 100. Further, the heater controllers 124 measure the power consumption of these heaters, and transmit it to the control section 100.

The MFC controllers 125 are configured to respectively control the MFCs (not shown) disposed on the process gas feed lines 17 (17a to 17e) and the purge gas supply line 18. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 5 and configured to exhaust gas from inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controllers 124, MFC controllers 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line 5, and process gas feed lines 17. Further, the CPU 115 outputs control signals, based on measurement data, to the heater controllers 124, MFC controllers 125, valve controllers 126, and vacuum pump 127, to control the respective portions mentioned above in accordance with a process recipe.

Figure 4:
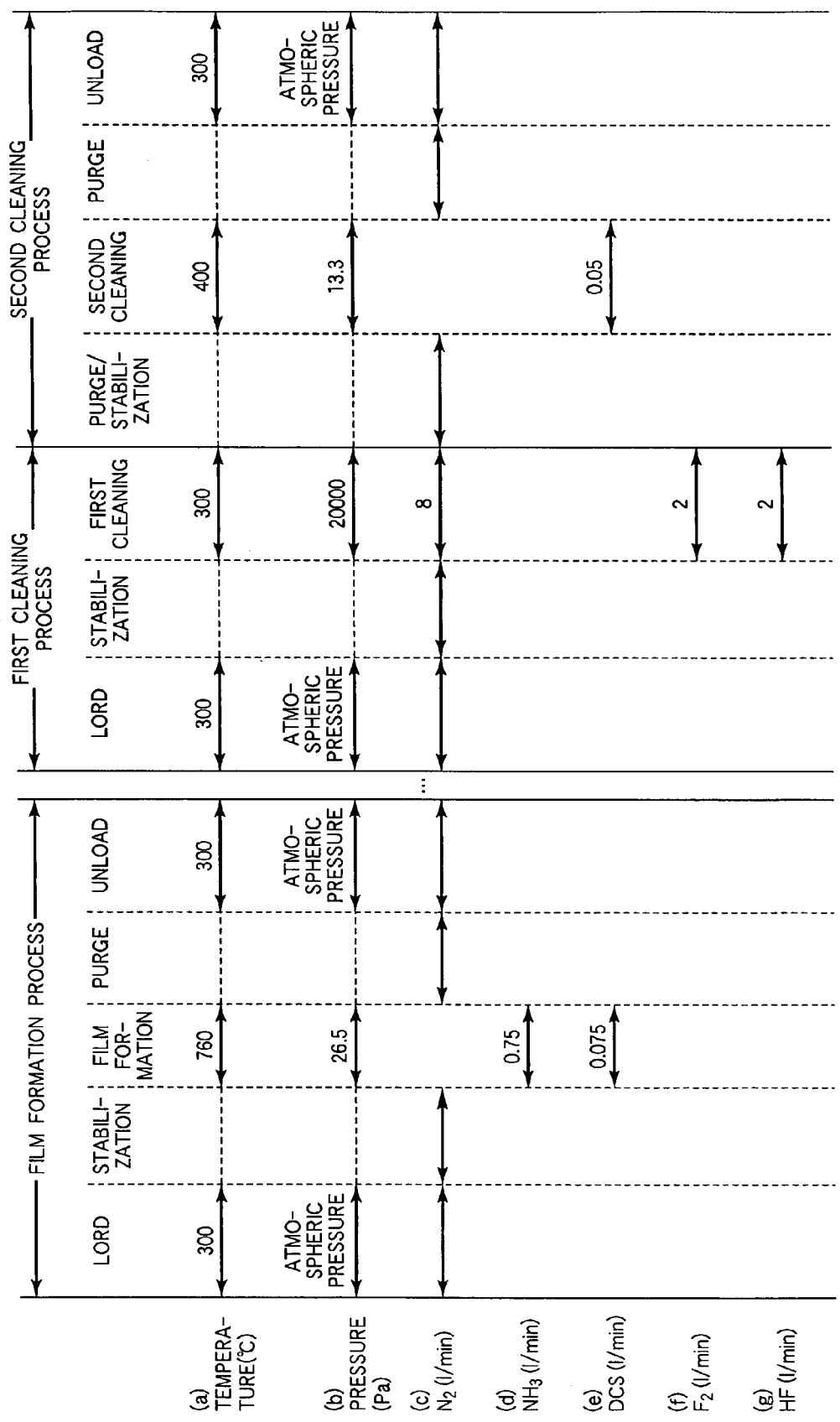
FIG. 4 is a view showing the recipe of a film formation process and cleaning processes according to an embodiment of the present invention.

Next, an explanation will be given of a method for using the heat-processing apparatus 1 described above, with reference to FIG. 4. Specifically, at first, a silicon nitride film is formed on semiconductor wafers W within the reaction tube 2. Then, by-product films, which contain silicon nitride as the main component (it means 50% or more), deposited inside the reaction tube 2 are removed. Then, contaminants (particularly, metal contaminants) present at the inner surface of the reaction tube 2 are removed. FIG. 4 is a view showing the recipe of a film formation process and cleaning processes according to an embodiment of the present invention.

The respective components of the heat-processing apparatus 1 described below are operated under the control of the control section 100 (CPU 115). The temperature and pressure inside the reaction tube 2 and the gas flow rates during the processes are set in accordance with the recipe shown in FIG. 4, while the control section 100 (CPU 115) controls the heater controller 124 (for the heaters 8 and 16), MFC controllers 125 (for the process gas feed lines 17 and purge gas feed line 18), valve controllers 126, and vacuum pump 127, as described above.

In the film formation process, at first, the interior of the reaction tube 2 is heated by the heater 16 at a predetermined load temperature, such as 300° C., as shown in FIG. 4, (a). Further, nitrogen ($N_2$) is supplied through the purge gas feed line 18 into the reaction tube 2 at a predetermined flow rate, as shown in FIG. 4, (c). Then, a wafer boat 11 that holds semiconductor wafers W is placed on the lid 6, and the lid 6 is moved up by the boat elevator 128. Consequently, the wafer boat 11 with the semiconductor wafers W supported thereon is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 4, (c). Further, the interior of the reaction tube 2 is heated by the heater 16 to a predetermined film formation temperature (process temperature), such as 760° C., as shown in FIG. 4, (a). Furthermore, gas inside the reaction tube 2 is exhausted to set the interior of the reaction tube 2 at a predetermined pressure, such as 26.5 Pa (0.2 Torr), as shown in FIG. 4, (b). The pressure reduction and heating operations are kept performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a first film formation gas containing a silicon-containing gas and a second film formation gas containing a nitriding gas are supplied through process gas feed lines 17 (feed lines 17a and 17b) into the reaction tube 2. In this embodiment, the first film formation gas contains DCS ($SiH_2Cl_2$) supplied at a predetermined flow rate, such as 0.075 liters/min., as shown in FIG. 4, (e). The second film formation gas contains ammonia ($NH_3$) supplied at a predetermined flow rate, such as 0.75 liters/min., as shown in FIG. 4, (d).

The DCS and ammonia supplied into the reaction tube 2 cause a thermal decomposition reaction, using heat inside the reaction tube 2. The decomposition components produce silicon nitride ($Si_3N_4$), from which a silicon nitride film is formed on the surface of the semiconductor wafers W (film formation step).

When the silicon nitride film formed on the surface of the semiconductor wafers W reaches a predetermined thickness, the supply of DCS and ammonia through the process gas feed lines 17 is stopped. Then, the interior of the reaction tube 2 is exhausted, and nitrogen is supplied through the purge gas feed line 18 at a predetermined flow rate, as shown in FIG. 4, (c). By doing so, the gas inside the reaction tube 2 is exhausted to the exhaust line 5 (purge step). It is preferable to perform cyclic purge of repeating the gas exhaust and nitrogen gas supply for the interior of the process tube 2 a plurality of times, in order to reliably exhaust the gas inside the process tube 2.

Then, the interior of the reaction tube 2 is set by the heater 16 at a predetermined temperature, such as 300° C., as shown in FIG. 4, (a). Further, nitrogen is supplied through the purge gas feed line 18 into the reaction tube 2 at a predetermined flow rate, as shown in FIG. 4, (c). The pressure inside the process tube 2 is thereby returned to atmospheric pressure, as shown in FIG. 4, (b). Then, the lid 6 is moved down by the boat elevator 128, and the wafer boat 11 is thereby unloaded (unload step).

Repeating this film formation process a plurality of times, silicon nitride produced by the film formation process is deposited (adhered) not only on the surface of semiconductor wafers W, but also on the inner surface of the reaction tube 2 and so forth, as by-product films. Accordingly, after the film formation process is repeated a plurality of times, a first cleaning process is performed to remove the by-product films containing silicon nitride as the main component. Further, a second cleaning process is performed to remove contaminants that appear on the inner surface of the reaction tube 2 when the by-product films are removed therefrom by the first cleaning process. The conditions of the first cleaning process are arranged such that the etching rate for silicon nitride is higher and the etching rate for the material (quartz) forming the inner surface of the reaction tube 2 is lower. On the other hand, the conditions of the second cleaning process are arranged such that formation of metal chlorides is promoted by a reaction of chlorine contained in the second cleaning gas with metal contaminants, such as Fe, Al, Ni, Co, Na, and Ca.

In the first cleaning process, at first, the interior of the reaction tube 2 is maintained by the heater 16 at a predetermined load temperature, such as 300° C., as shown in FIG. 4, (a). Further, nitrogen is supplied through the purge gas feed line 18 into the reaction tube 2 at a predetermined flow rate, as shown in FIG. 4, (c). Then, an empty wafer boat 11 that holds no semiconductor wafers W is placed on the lid 6, and the lid 6 is moved up by the boat elevator 128. Consequently, the wafer boat 11 is loaded into the reaction tube 2 and the reaction tube 2 is airtightly closed (load step).

Then, nitrogen is supplied through the purge gas feed line 18 into the reaction tube 2 at a predetermined flow rate, as shown in FIG. 4, (c). Further, the interior of the reaction tube 2 is heated by the heater 16 at a predetermined cleaning temperature, such as 300° C., as shown in FIG. 4, (a). Furthermore, gas inside the reaction tube 2 is exhausted to set the interior of the reaction tube 2 at a predetermined pressure, such as 20,000 Pa (150 Torr), as shown in FIG. 4, (b). The pressure reduction and heating operations are kept performed until the reaction tube 2 is stabilized at the predetermined pressure and temperature (stabilization step).

When the interior of the reaction tube 2 is stabilized at the predetermined pressure and temperature, the supply of nitrogen through the purge gas feed line 18 is stopped. Then, the first cleaning gas comprising fluorine ($F_2$), hydrogen fluoride (HF), and nitrogen is supplied through process gas feed lines 17 (feed lines 17c, 17d, and 17e) into the reaction tube 2. In this embodiment, fluorine is supplied at a predetermined flow rate, such as 2 liters/min., as shown in FIG. 4, (f), hydrogen fluoride is supplied at a predetermined flow rate, such as 2 liters/min., as shown in FIG. 4(g), and nitrogen or dilution gas is supplied at a predetermined flow rate, such as 8 liters/min., as shown in FIG. 4, (c).

The first cleaning gas is heated in the reaction tube 2, and fluorine in the first cleaning gas is activated, thereby forming a state in which a number of reactive free atoms are present. The activated fluorine comes into contact with by-product films (containing silicon nitride as the main component) deposited on the inner surface of the reaction tube 2 and so forth. Consequently, the by-product films are etched and removed (first cleaning step).

In this first cleaning step, the temperature inside the reaction tube 2 is preferably set to be lower than 400° C., and more preferably to be 250° C. to 380° C. If the temperature is lower than 250° C., the first cleaning gas is hardly activated, so the etching rate of the first cleaning gas for silicon nitride may be lower than the necessary value. If the temperature is higher than 400° C., the etching rate for quartz or silicon carbide (SiC) may become too high, so the etching selectivity is deteriorated.

In this first cleaning step, the pressure inside the reaction tube 2 is preferably set to be 13.3 Pa (0.1 Torr) to 66.5 kPa (500 Torr), and more preferably to be 13.3 kPa (100 Torr) to 59.85 kPa (450 Torr). Where this range is used, the etching rate for silicon. nitride is high, so the etching selectivity thereon against quartz or silicon carbide (SiC) is improved.

When the by-product films deposited inside the reaction tube 2 are removed, the supply of the first cleaning gas through the process gas feed lines 17 is stopped. Then, the second cleaning process is started.

In the second cleaning process, at first, the interior of the reaction tube 2 is exhausted, and nitrogen is supplied through the purge gas feed line 18 into the reaction tube 2 at a predetermined flow rate, as shown in FIG. 4, (c). By doing so, the gas inside the reaction tube 2 is exhausted to the exhaust line 5. Further, the interior of the reaction tube 2 is set by the heater 16 at a predetermined temperature, such as 400° C., as shown in FIG. 4, (a). Furthermore, the interior of the reaction tube 2 is set at a predetermined pressure, such as 13.3 Pa (0.1 Torr), as shown in FIG. 4, (b). These operations are kept performed until the reaction tube 2 is stabilized at the predetermined pressure and temperature (purge/stabilization step).

When the interior of the reaction tube 2 is stabilized at the predetermined pressure and temperature, the supply of nitrogen through the purge gas feed line 18 is stopped. Then, the second cleaning gas comprising DCS is supplied through a process gas feed line 17 (feed line 17a) into the reaction tube 2. In this embodiment, DCS is supplied at a predetermined flow rate, such as 0.05 liters/min., as shown in FIG. 4, (e).

The second cleaning gas is heated in the reaction tube 2, and chlorine in the first cleaning gas is activated, thereby forming a state in which a number of reactive free atoms are present. The activated chlorine reacts with metal contaminants present at the inner surface of the reaction tube 2 (on and in the quartz surface), and metal chlorides are thereby produced. The metal chlorides thus produced are sublimed and exhausted out of the reaction tube 2 while being carried by the exhaust gas flow. Consequently, the reaction tube 2 is prevented from discharging metal contaminants therefrom during the film formation process, whereby contamination, such as metal contamination, is suppressed on the formed film (second cleaning step).

In the second cleaning step, the temperature inside the reaction tube 2 is preferably set to be 200° C. or more. If the temperature is lower than 200° C., the chlorine-containing gas (DCS) may be liquefied and cause corrosion in cooperation with residual moisture. The temperature inside the reaction tube 2 is preferably set to be 700° C. or less, and more preferably to be 500° C. or less. If the temperature is higher than 500° C., particularly higher that 70° C., the chlorine-containing gas may cause Si film formation.

Accordingly, where DCS is used as a chlorine-containing gas, the temperature is preferably set to be 200° C. to 700° C., and more preferably to be 200° C. to 500° C.

In the second cleaning step, the pressure inside the reaction tube 2 is preferably set to be 13.3 Pa (0.1 Torr) to 53332 Pa (400 Torr), and more preferably to be 13.3 Pa (0.1 Torr) to 13333 Pa (100 Torr). Where this range is used, chlorine in the second cleaning gas reacts with metal contaminants present at the inner surface of the reaction tube 2 to produce metal chlorides. According to this embodiment, the process pressure of the film formation step is preferably set to be 13.3 Pa (0.1 Torr) to 53332 Pa (400 Torr), and more preferably to be 13.3 Pa (0.1 Torr) to 13333 Pa (100 Torr), such as less than 1333 Pa (10 Torr). Where the conditions described above are satisfied, metal contaminants, which may be discharged during the film formation process, are reliably transformed into metal chlorides, and exhausted out of the reaction tube 2.

After metal contaminants present at the inner surface of the reaction tube 2 are removed, the supply of the second cleaning gas through the process gas feed line 17 is stopped. Then, the interior of the reaction tube 2 is exhausted, and nitrogen is supplied through the purge gas feed line 18 into the reaction tube 2 at a predetermined flow rate, as shown in FIG. 4, (c). By doing so, the gas inside the reaction tube 2 is exhausted to the exhaust line 5 (purge step).

Then, the interior of the reaction tube 2 is set by the heater 16 at a predetermined temperature, such as 300° C., as shown in FIG. 4, (a). Further, nitrogen is supplied through the purge gas supply line 18 into the reaction tube 2 at a predetermined flow rate, as shown in FIG. 4, (c). The pressure inside the process tube 2 is thereby returned to atmospheric pressure, as shown in FIG. 4, (b). Then, the lid 6 is moved down by the boat elevator 128, and the wafer boat 11 is thereby unloaded (unload step).

As the process described above is being performed, the by-product films and metal contaminants deposited or present on the inner surface of the reaction tube 2, the surface of the wafer boat 11, and so forth are removed. Thereafter, the wafer boat 11 with a new lot of semiconductor wafers W mounted thereon is placed on the lid 6, and the film formation process is started again in the manner described above.

<Experiment>

As a present example PE1 of the embodiment described above, the film formation process and first and second cleaning processes were performed, as described above, in the heat-processing apparatus shown in FIGS. 1 and 2, so that the reaction tube 2 was thus pre-treated. As a comparative example CE1, the film formation process and first cleaning process were performed under the same conditions as the present example PE1, and then only nitrogen purge was performed in place of the second cleaning process, so that the reaction tube 2 was thus pre-treated. Semiconductor wafers were loaded into the reaction tube 2 thus pre-treated, and then the interior of the reaction tube 2 was heated to 800° C. to perform a heat process on the semiconductor wafers. Then, the semiconductor wafers were unloaded from the reaction tube 2, and Fe concentration (atoms/cm$^2$) on the wafer surface was measured.

Figure 5:
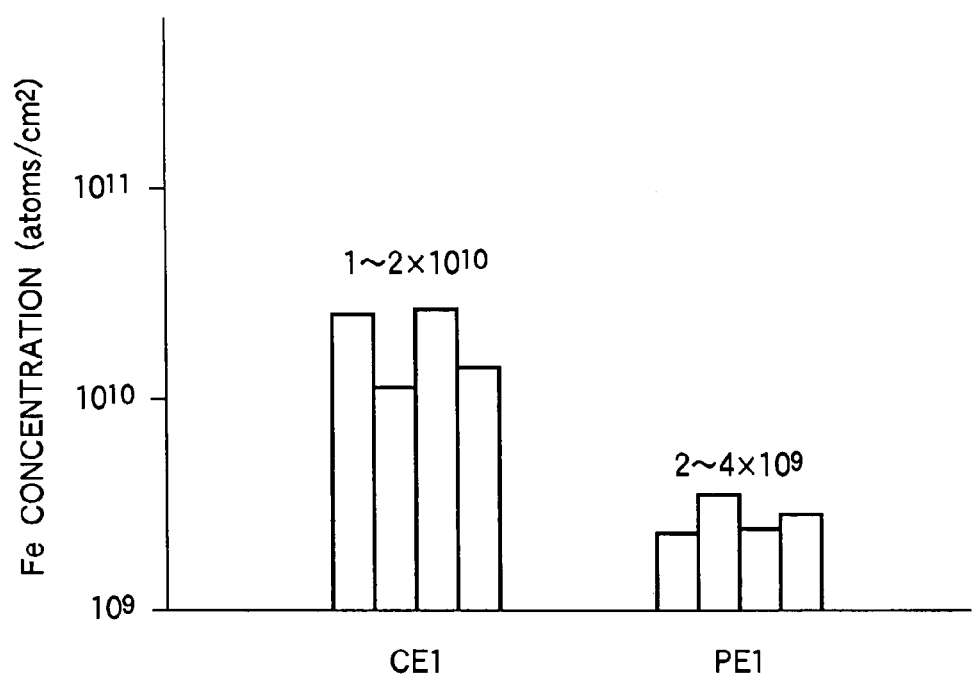
FIG. 5 is a graph showing Fe concentration on a silicon wafer surface, in a present example PE1 and a comparative example CE1, obtained by an experiment.

FIG. 5 is a graph showing the Fe concentration on the silicon wafer surface, in the present example PE1 and comparative example CE1, obtained by this experiment. As shown in FIG. 5, it was confirmed that the Fe concentration on the semiconductor wafers was greatly decreased by the second cleaning process. The same measurement was further performed for the concentrations of Al and Ni, and resulted in that the metal concentration on the semiconductor wafers was decreased by the second cleaning process. It is thought that the result described above was due to a reaction of activated chlorine with metals present on and in the quartz of the reaction tube 2, wafer boat 11, and so forth, to produce metal chlorides, which were then exhausted from the reaction tube 2.

<Consequence and Modification>

As described above, according to the embodiment, the second cleaning process is performed after the first cleaning step, so that metal contaminants present inside the reaction tube 2 are removed. Consequently, the reaction tube 2 is prevented from discharging metal contaminants therefrom during the film formation process, whereby contamination, such as metal contamination, is suppressed on the formed film.

In the embodiment described above, the second cleaning gas comprises DCS gas as a chlorine-containing gas. In this respect, the chlorine-containing gas may comprise one or more gases selected from the group consisting of chlorine, hydrogen chloride, dichlorosilane (DCS), tetrachlorosilane, hexachlorodisilane, trichlorosilane, and boron trichloride.

Where the chlorine-containing gas of the second cleaning gas comprises chlorine, hydrogen chloride, or boron trichloride, if the process temperature is higher than 700° C., particularly higher than 1,050° C., the quartz of the reaction tube 2 or the like may be etched. Accordingly, in this case, the temperature inside the reaction tube 2 during the second cleaning step is preferably set to be 200° C. to 1,050° C., and more preferably to be 200° C. to 700° C.

Where the chlorine-containing gas of the second cleaning gas comprises dichlorosilane, tetrachlorosilane, hexachlorodisilane, or trichlorosilane, this gas can be used as a silicon source gas of the first film formation gas. If the temperature inside the gas reaction tube 2 during the second cleaning step is too high, dichlorosilane, tetrachlorosilane, hexachlorodisilane, or trichlorosilane may cause Si film formation. Accordingly, in this case, the temperature inside the reaction tube 2 is preferably set to be 200° C. to 700° C., and more preferably to be 200° C. to 500° C.

In the embodiment described above, the first cleaning gas comprises a mixture gas (containing no chlorine) of fluorine, hydrogen fluoride gas, and nitrogen used as a dilution gas; which is an example of halogen-containing acidic gas or a mixture gas of a halogen gas and hydrogen gas. However, the first cleaning gas may be any gas, as long as it can remove a by-product film deposited due to the film formation process. The first cleaning gas preferably contains a dilution gas, because the processing time can be more easily controlled if it is so arranged. However, the first cleaning gas may contain no dilution gas. The dilution gas consists preferably of an inactive gas, such as nitrogen gas, helium gas (He), neon gas (Ne), or argon gas (Ar).

In the embodiment described above, Fe, Al, and Ni are removed by the second cleaning process, but they are merely examples of a removable metal contaminant. In this respect, another metal contaminant, such as, Co, Na, and/or Ca, may be removed by the second cleaning process.

In the embodiment described above, the first and second cleaning gases are activated when they are supplied into the reaction tube 2 heated to a predetermined temperature. Alternatively, the first cleaning gas and/or second cleaning gas may be supplied into the reaction tube 2, while being activated outside the reaction tube 2 by an activation mechanism GAM (see FIG. 1), which is disposed on the corresponding process gas feed line 17. In this case, the temperature inside the reaction tube 2 can be lowered-during the first and second cleaning steps. The activation mechanism GAM may be arranged to utilize one or more media selected from the group consisting of heat, plasma, light, and catalyst.

In the embodiment described above, the removal target is by-product films containing silicon nitride as the main component, which are deposited inside the reaction tube 2 when a silicon nitride film is formed on semiconductor wafers W. Alternatively, the present invention may be applied to a case where the removal target is by-product films that are deposited inside the reaction tube 2 when another silicon-containing insulating film (such as a silicon oxide film or silicon oxynitride film) is formed on semiconductor wafers W. In this case, in order to form a silicon oxide film or silicon oxynitride film, a first film formation gas containing a silicon-containing gas and a second film formation gas containing an oxidizing gas or oxynitriding gas may be supplied.

In the embodiment described above, the process gas feed lines 17 are disposed in accordance with the type of gases. Alternatively, for example, process gas feed lines 17 may be disposed in accordance with the type of process steps. Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiment described above, the heat-processing apparatus employed is a heat-processing apparatus of the batch type having a single-tube structure. However, for example, the present invention may be applied to a vertical heat-processing apparatus of the batch type having a reaction tube of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., an LCD.

The control section 100 of the heat-processing apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for a semiconductor process, the apparatus including a reaction chamber configured to accommodate a holder that supports a plurality of target substrates at intervals in a vertical direction, the method comprising:

performing a film formation process of forming a product film by CVD on the target substrates supported on the holder inside the reaction chamber, while supplying a first film formation gas and a second film formation gas into the reaction chamber, the product film being a film of a substance selected from the group consisting of silicon nitride, silicon oxide, and silicon oxynitride, the first film formation gas being selected from the group consisting of dichlorosilane, tetrachlorosilane, hexachlorodisilane, and trichlorosilane, and the second film formation gas being selected from the group consisting of a nitride gas, an oxidizing gas, and an oxynitriding gas;

then unloading the holder with the target substrates supported thereon from the reaction chamber;

then performing a first cleaning process of removing a by-product film generated by the film formation process from an inner surface of the reaction chamber, while supplying a first cleaning gas containing a halogen and hydrogen as elements into the reaction chamber, and setting an interior of the reaction chamber at a first temperature of less than 400° C. and a first pressure of 13.3 Pa to 66.5 kPa to activate the first cleaning gas; and then, in succession to the first cleaning process, without any film formation process interposed therebetween, performing a second cleaning process of removing a metal contaminant from the inner surface of the reaction chamber, while supplying the first film formation gas as a second cleaning gas into the reaction chamber without supplying the second film formation gas into the reaction chamber, and setting the interior of the reaction chamber at a second temperature of 200 to 700° C. and a second pressure of 13.3 Pa to 53,332 Pa to activate the second cleaning gas.

2. The method according to claim 1, wherein the metal contaminant comprises one or more metals selected from the group consisting of Fe, Al, Ni, Co, Na, and Ca.

3. The method according to claim 1, wherein the inner surface of the reaction chamber contains as a main component a material selected from the group consisting of quartz and silicon carbide.

4. The method according to claim 1, wherein the second temperature is set to be 200 to 500° C.

5. The method according to claim 1, wherein the second pressure is set to be 13.3 Pa to 13,333 Pa.

6. The method according to claim 1, wherein the first cleaning gas comprises a gas containing no chlorine, which is selected from the group consisting of a halogen-containing acidic gas, and a mixture gas of a halogen gas and hydrogen gas.

7. The method according to claim 1, wherein the first temperature is set to be 250 to 380° C.

8. The method according to claim 1, wherein the first pressure is set to be 13.3 kPa to 59.85 kPa.

9. The method according to claim 1, wherein supply of the first cleaning gas is switched to supply of the second cleaning gas with a period interposed therebetween of supplying an inactive gas into the reaction chamber while not supplying the first and second cleaning gases.

10. The method according to claim 1, wherein the film formation process is arranged to use a process pressure of 13.3 Pa to 13,333 Pa.

11. The method according to claim 1, wherein the first film formation gas is dichlorosilane.

12. The method according to claim 1, wherein the second film formation gas is a nitriding gas.

13. The method according to claim 1, wherein the second film formation gas is ammonia.

14. The method according to claim 4, wherein the first pressure is set to be 13.3 kPa to 59.85 kPa and the second pressure is set to be 13.3 Pa to 13,333 Pa.

15. The method according to claim 1, wherein the second cleaning process is performed without supplying any gas other than the first film formation gas into the reaction chamber.

* * * * *